(12) United States Patent
Huang et al.

(10) Patent No.: US 8,158,489 B2
(45) Date of Patent: Apr. 17, 2012

(54) FORMATION OF TSV BACKSIDE INTERCONNECTS BY MODIFYING CARRIER WAFERS

(75) Inventors: Hon-Lin Huang, Hsin-Chu (TW);
Ching-Wen Hsiao, Banqiao (TW);
Kuo-Ching Hsu, Taipei (TW);
Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/751,512

(22) Filed: Mar. 31, 2010

(65) Prior Publication Data

US 2010/0330798 A1    Dec. 30, 2010

Related U.S. Application Data

(60) Provisional application No. 61/220,803, filed on Jun. 26, 2009.

(51) Int. Cl.
*H01L 21/30*    (2006.01)

(52) U.S. Cl. ........................................ 438/455; 438/459

(58) Field of Classification Search .................. None
See application file for complete search history.

(56) References Cited

U.S. PATENT DOCUMENTS

| | | | |
|---|---|---|---|
| 3,461,357 A | 8/1969 | Mutter et al. | |
| 5,391,917 A | 2/1995 | Gilmour et al. | |
| 5,510,298 A | 4/1996 | Redwine | |
| 5,767,001 A | 6/1998 | Bertagnolli et al. | |
| 5,897,362 A * | 4/1999 | Wallace | 438/455 |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,376,332 B1 * | 4/2002 | Yanagita et al. | 438/458 |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,897,125 B2 | 5/2005 | Morrow et al. | |
| 6,924,551 B2 | 8/2005 | Rumer et al. | |
| 6,962,867 B2 | 11/2005 | Jackson et al. | |

(Continued)

OTHER PUBLICATIONS

Shen, L-C, et al., "A Clamped Through Silicon Via (TSV) Interconnection for Stacked Chip Bonding Using Metal Cap on Pad and Metal Column Forming in Via," 2008, IEEE, pp. 544-549.

*Primary Examiner* — Scott B Geyer
(74) *Attorney, Agent, or Firm* — Slater & Matsil, L.L.P.

(57) ABSTRACT

An integrated circuit structure includes a semiconductor wafer, which includes a first notch extending from an edge of the semiconductor wafer into the semiconductor wafer. A carrier wafer is mounted onto the semiconductor wafer. The carrier wafer has a second notch overlapping at least a portion of the first notch. A side of the carrier wafer facing the semiconductor wafer forms a sharp angle with an edge of the carrier wafer. The carrier wafer has a resistivity lower than about $1 \times 10^8$ Ohm-cm.

16 Claims, 10 Drawing Sheets

U.S. PATENT DOCUMENTS

| | | |
|---|---|---|
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,291,542 B2 * | 11/2007 | Iwamatsu et al. ............. 438/455 |
| 7,297,574 B2 | 11/2007 | Thomas et al. |
| 7,335,972 B2 | 2/2008 | Chanchani |
| 7,355,273 B2 | 4/2008 | Jackson et al. |
| 7,371,663 B2 * | 5/2008 | Chen et al. ................... 438/460 |
| 7,786,584 B2 | 8/2010 | Barth et al. |
| 7,838,337 B2 | 11/2010 | Marimuthu et al. |
| 2004/0151917 A1 * | 8/2004 | Chen et al. ................... 428/446 |
| 2005/0236693 A1 * | 10/2005 | Kroninger et al. ............ 257/619 |
| 2006/0046431 A1 * | 3/2006 | Blietz et al. ................... 438/455 |
| 2006/0099791 A1 * | 5/2006 | Mitani et al. .................. 438/612 |
| 2007/0210259 A1 * | 9/2007 | Kerwin et al. ........... 250/370.11 |
| 2008/0035854 A1 * | 2/2008 | Jin et al. ..................... 250/396 R |
| 2008/0057678 A1 * | 3/2008 | Gadkaree et al. ............. 438/460 |
| 2008/0079121 A1 | 4/2008 | Han |
| 2008/0131679 A1 * | 6/2008 | Nakai et al. ................... 428/218 |
| 2009/0140381 A1 | 6/2009 | Lin et al. |
| 2010/0013102 A1 | 1/2010 | Tay et al. |
| 2010/0022034 A1 | 1/2010 | Antol et al. |
| 2010/0090318 A1 | 4/2010 | Hsu et al. |
| 2010/0090319 A1 | 4/2010 | Hsu et al. |
| 2010/0276787 A1 | 11/2010 | Yu et al. |
| 2011/0165776 A1 | 7/2011 | Hsu et al. |
| 2011/0186990 A1 | 8/2011 | Mawatari et al. |
| 2011/0193235 A1 | 8/2011 | Hu et al. |
| 2011/0233785 A1 | 9/2011 | Koester et al. |

* cited by examiner

US 8,158,489 B2

FORMATION OF TSV BACKSIDE INTERCONNECTS BY MODIFYING CARRIER WAFERS

This application claims the benefit of U.S. Provisional Application No. 61/220,803 filed on Jun. 26, 2009, entitled "Improving the Formation of TSV Backside Interconnects by Modifying Carrier Wafers," which application is hereby incorporated herein by reference.

TECHNICAL FIELD

This invention relates generally to integrated circuit structures, and more particularly to through-silicon vias, and even more particularly to the formation of interconnect structures on the backside of wafers and connected to the through-silicon vias.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and lengths of interconnections between devices as the number of devices increases. When the number and the lengths of interconnections increase, both circuit RC delay and power consumption increase.

Efforts for resolving the above-discussed limitations include the use of three-dimensional integrated circuits (3DICs) and stacked dies are commonly used. Through-silicon vias (TSVs) are thus used in 3DICs and stacked dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

The conventional formation process of backside TSV connections suffers from drawbacks. Referring to FIG. 1, which illustrates a cross-sectional view of an intermediate stage in the manufacturing of a backside interconnect structure, silicon wafer 100 includes TSVs 102. Silicon wafer 100 is mounted onto carrier wafer 104 through glue 106. Under-bump metallurgy (UBM) 108 is deposited onto silicon wafer 100. Carrier wafer 104 is typically larger than silicon wafer 100; UBM 108 is thus also deposited on carrier wafer 104. Since carrier wafer 104 has beveled areas 110, UBM 108 includes parts deposited on beveled areas 110, and these parts of UBM 108 are prone to scratching and peeling. In the manufacturing processes, the structure shown in FIG. 1 may be clamped or transferred by robots. When the portions of UBM 108 on beveled areas 110 are clamped or touched by clamps or robots, particles may fall off and contaminate the wafers.

Another problem is the difficulty in finding notches. FIG. 2A illustrates a top view of the structure shown in FIG. 1. Notch 112 is formed in silicon wafer 100 for alignment purposes. FIG. 2B illustrates a cross-sectional view of the structure shown in FIG. 2A, wherein the cross-sectional view is taken in a plane crossing line 2B-2B in FIG. 2A. It is noted that UBM 108 is also deposited onto the portion of carrier wafer 104 exposed through notch 112. Since UBM 108 is not transparent, instruments such as photo steppers often cannot find notch 112, and hence cannot perform alignments for the subsequent processes.

To form the backside TSV connection, the structure as shown in FIG. 1 needs to be placed in chambers, and secured by an electrostatic chuck (ESC or E-Chuck). However, carrier wafer 104 is typically formed of glass and cannot be secured on the ESC firmly. This is partially due to the inadequate mobile ions in the glass. A backside interconnect structure and a manufacturing method overcoming the above-discussed problems are thus needed.

SUMMARY OF THE INVENTION

In accordance with one aspect of the embodiment, an integrated circuit structure includes a semiconductor wafer, which includes a first notch extending from an edge of the semiconductor wafer into the semiconductor wafer. A carrier wafer is mounted onto the semiconductor wafer. The carrier wafer has a second notch overlapping at least a portion of the first notch. A side of the carrier wafer facing the semiconductor wafer forms a sharp angle with an edge of the carrier wafer. The carrier wafer has a resistivity lower than about $1 \times 10^8$ Ohm-cm.

Other embodiments are also disclosed.

The advantageous features of the present invention include more reliable alignment, reduced particle generation, and improved ability for securing carrier wafers on E-chucks.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A method for forming a novel backside interconnect structure connecting to through-silicon vias (TSVs, also known as through-semiconductor vias) is provided. The intermediate stages in the manufacturing of an embodiment are illustrated. The variations of the embodiments are discussed. Throughout the various views and illustrative embodiments, like reference numbers are used to designate like elements.

Figure 1:
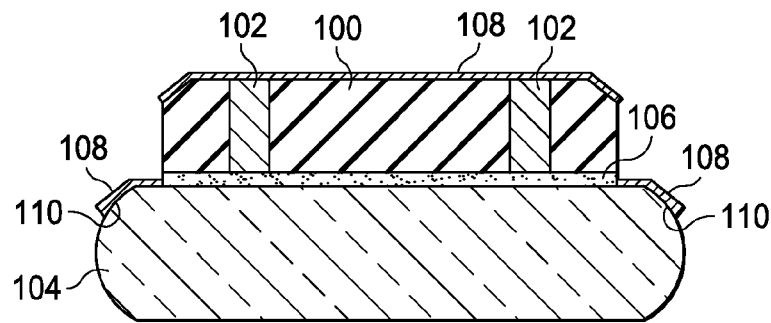
FIG. 1 illustrates a cross-sectional view of an intermediate stage in the manufacturing of TSV backside connections, wherein beveled areas of a carrier wafer are deposited with a layer of an under-bump metallurgy.
Figure 2A:
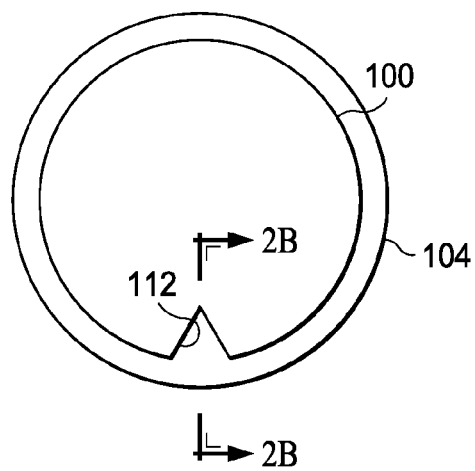
FIG. 2A illustrates a top view of a silicon wafer mounted onto a carrier wafer, wherein a notch is formed in the silicon wafer.
Figure 2B:
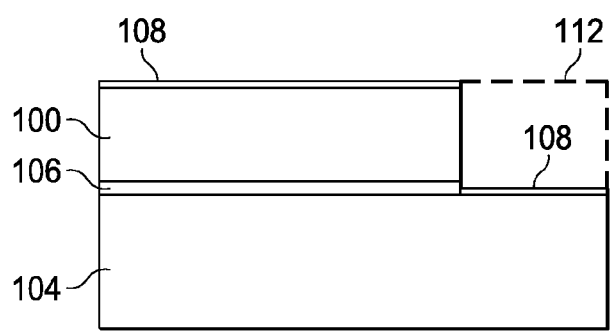
FIG. 2B illustrates a cross-sectional view of the structure shown in FIG. 2A.
Figure 3A:
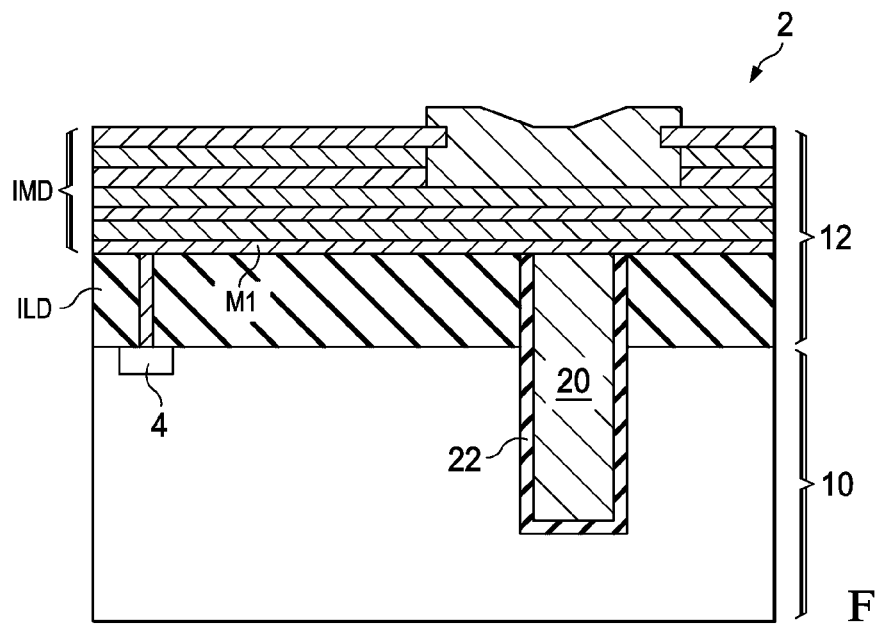
FIGS. 3A through 12 are top views and cross-sectional views of intermediate stages in the manufacturing of an interconnect structure in accordance with an embodiment.

Referring to FIG. 3A, wafer 2, which includes substrate 10, is provided. Substrate 10 may be a semiconductor substrate, such as a bulk silicon substrate, although it may include other semiconductor materials such as group III, group IV, and/or group V elements. Integrated circuit devices such as transistors (illustrated by block 4) may be formed at the front surface (the surface facing up in FIG. 3A) of substrate 10. Interconnect structure 12, which includes metal lines and vias (not shown) formed therein, is formed over substrate 10 and may be connected to the integrated circuit devices. The metal lines and vias may be formed of copper or copper alloys, and may be formed using the well-known damascene processes. Interconnect structure 12 may include commonly known inter-layer dielectrics (ILDs) and inter-metal dielectrics (IMDs).

TSV 20 is formed in substrate 10, and extends from the front surface (the surface facing up in FIG. 3A) of substrate 10 into substrate 10. In a first embodiment, as shown in FIG. 3A, TSV 20 is formed using a via-first approach, and is formed before the formation of a bottom metallization layer (commonly known as M1). Accordingly, TSV 20 only extends into the ILD that is used to cover the active devices, but not into the IMD layers in interconnect structure 12. In alternative embodiments (not shown), TSV 20 is formed using a via-last approach, and is formed after the formation of interconnect structure 12. Accordingly, TSV 20 penetrates through both substrate 10 and interconnect structure 12. Isolation layer 22 is formed on the sidewalls of TSV 20, and electrically insulates TSV 20 from substrate 10. Isolation layer 22 may be formed of commonly used dielectric materials such as silicon nitride, silicon oxide (for example, tetra-ethyl-ortho-silicate (TEOS) oxide), and the like.

Figure 3B:
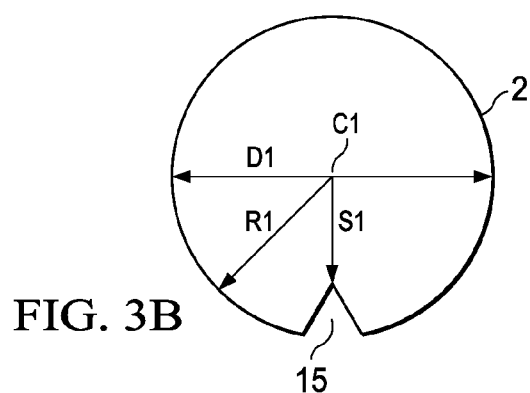

FIG. 3B illustrates a top view of wafer 2, which illustrates that notch 15 is formed in wafer 2. Notch 15 may extend from one surface of wafer 2 to an opposite surface (with both surfaces being flat surfaces). Also, notch 15 extends from an edge of wafer 2 into wafer 2. In an embodiment, notch 15 has a triangular shape in the top view. In other embodiments, notch 15 may have other shapes such as rectangles in the top view.

Figure 4A:
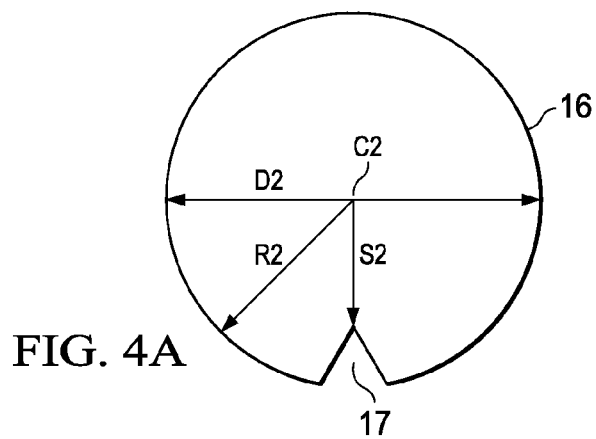

FIG. 4A illustrates a top view of carrier wafer (also sometimes referred to as a carrier substrate) 16. Carrier wafer 16 may be formed of glass, Si, glass ceramics, or the like. In an embodiment, carrier wafer 16 has a resistivity lower than about $1 \times 10^8$ Ohm-cm. The resistivity may also be lower than about $1 \times 10^6$ Ohm-cm, or even lower than about $1 \times 10^3$ Ohm-cm. This may be achieved, for example, by doping more mobile ions such as Na, K, Al, or the like to an appropriate concentration in the manufacturing of carrier wafer 16. By reducing the resistivity of carrier wafer 16, in subsequent processes, carrier wafer 16 may be secured on electrostatic chucks more reliably.

Carrier wafer 16 also includes notch 17, which may also extend from one surface to the opposite side of carrier wafer 16 (with both surfaces being flat surfaces). In an embodiment, diameter D2 of carrier wafer 16 is greater than diameter D1 of wafer 2. Further, distance S2 from center C2 of carrier wafer 16 to notch 17 is smaller than radius R1 of wafer 2 (refer to FIG. 3B). Distance S2 may also be greater than, equal to, or smaller than, distance S1 from center C1 of wafer 2 to the nearest point of notch 15.

Figure 4B:
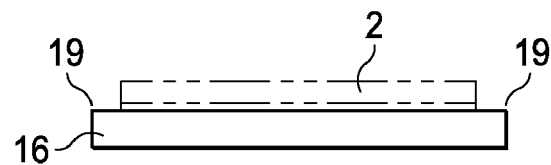

FIG. 4B illustrates a cross-sectional view of carrier wafer 16. Preferably, top corners 19 (on the side facing the subsequently bonded wafer 2, which is shown using dotted lines) have a sharp profile with no beveled areas. In other words, the side of carrier wafer 16 forms a sharp angle (for example, 90 degrees) with the edge of carrier wafer 16.

Figure 5A:
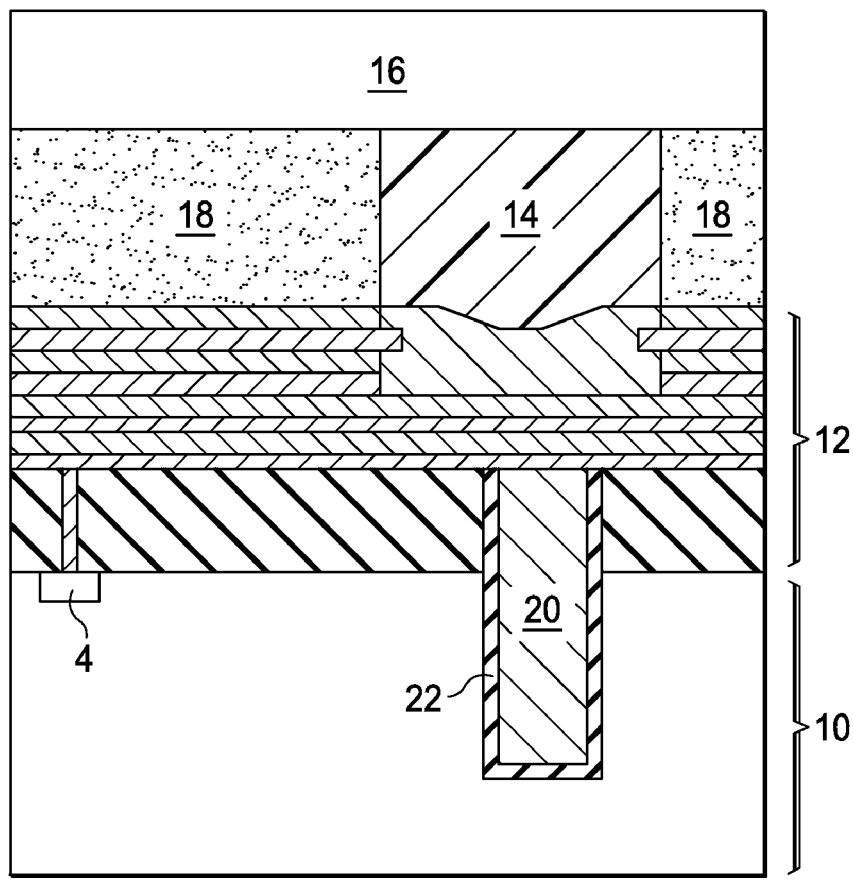

Referring to FIG. 5A, bond pad 14 is formed on the front side (the side facing up in FIG. 3A) of, and protrudes beyond, the front surface of wafer 2. Wafer 2 is then mounted on carrier wafer 16 through adhesive 18. Preferably, after the bonding, warpage W (see FIGS. 5E and 5F) of the combined structure including wafer 2 and carrier wafer 16 is less than about 20 μm, or even less than about 1 μm. FIG. 5E illustrates a first example of warpage W. It is realized that warpage W may also be in an opposite direction, as shown in FIG. 5F. The reduction in warpage W may be achieved by glass flatness or glue material control.

Figure 5B:
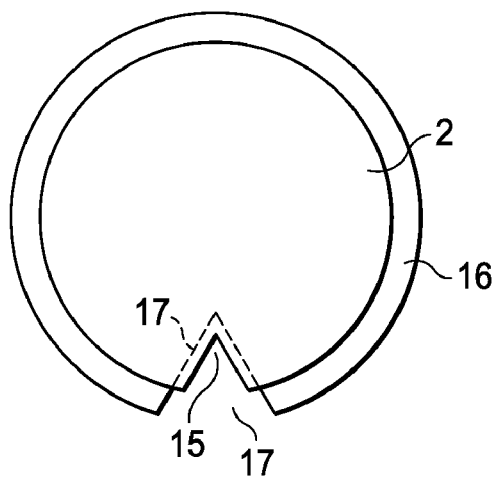
Figure 5C:
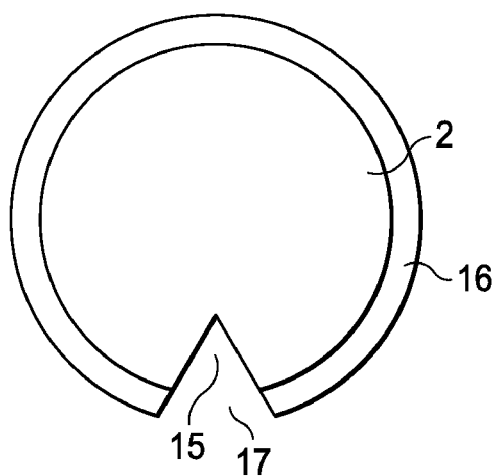
Figure 5D:
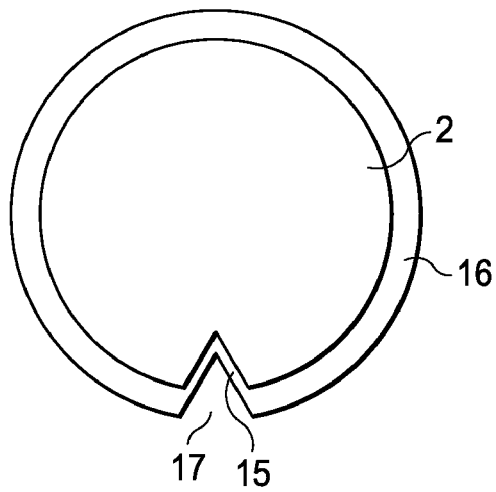
Figure 5E:
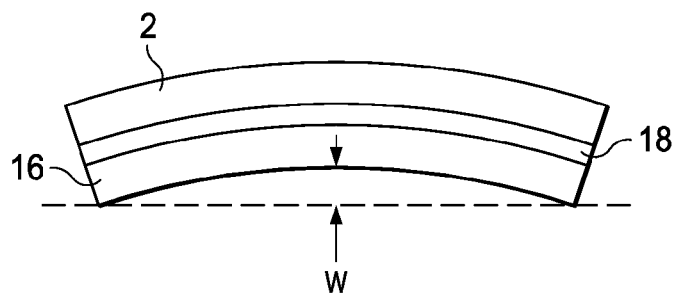
Figure 5F:
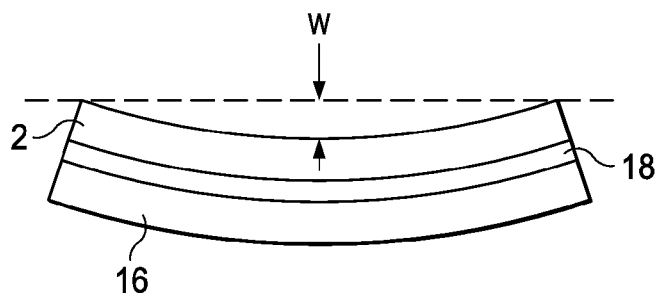

FIG. 5B illustrates a top view of the structure shown in FIG. 5A. In an embodiment, as shown in FIG. 5B, a portion of notch 17 overlaps an entirety of notch 15, and may extend under wafer 2. In alternative embodiments, as shown in FIG. 5C, edges of notch 17 are aligned to edges of notch 15. In yet other embodiments, as shown in FIG. 5D, an entirety of notch 17 overlaps only a portion of notch 15.

Figure 6:
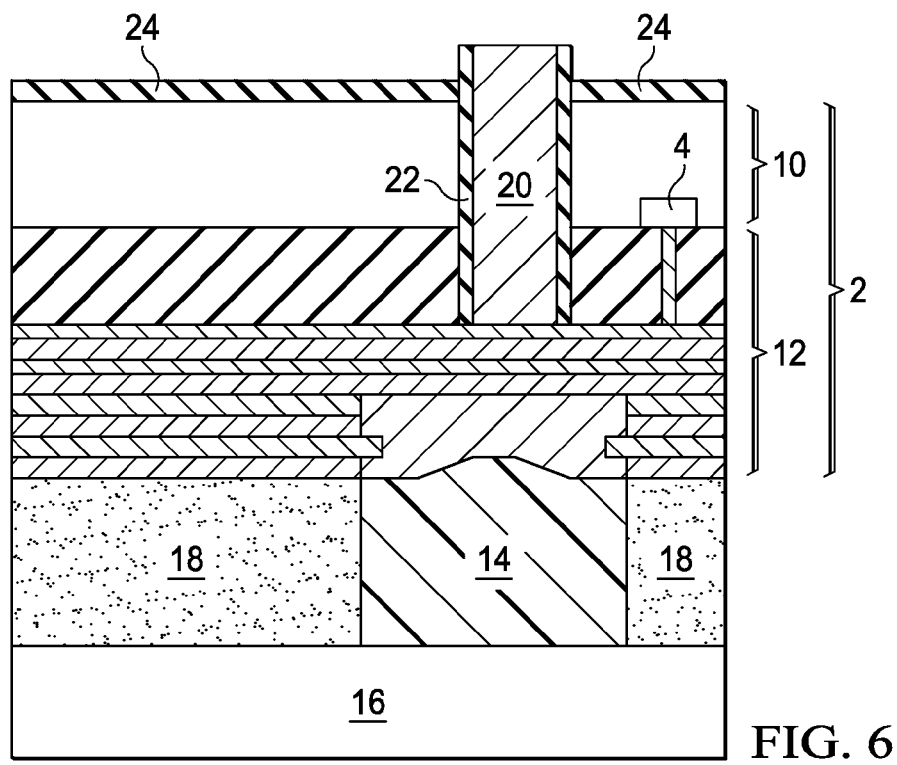

In FIG. 6, a backside grinding is performed to remove excess portions of substrate 10. A chemical mechanical polish (CMP) is performed to the backside of wafer 2, so that TSV 20 is exposed. Backside isolation layer 24 is formed to cover the backside of substrate 10. In an exemplary embodiment, the formation of backside isolation layer 24 includes etching back the back surface of substrate 10, blanket forming backside isolation layer 24, and performing a light chemical mechanical polish (CMP) to remove the portion of backside isolation layer 24 directly over TSV 20. Accordingly, TSV 20 is exposed through an opening in backside isolation layer 24. In alternative embodiments, the opening in backside isolation layer 24, through which TSV 20 is exposed, is formed by etching. Since wafer 2 may include a plurality of TSVs, the reduction in the warpage will result in a uniform exposure of all TSVs in wafer 2, rather than having some of the TSVs not exposed, while others are over exposed.

Figure 7A:
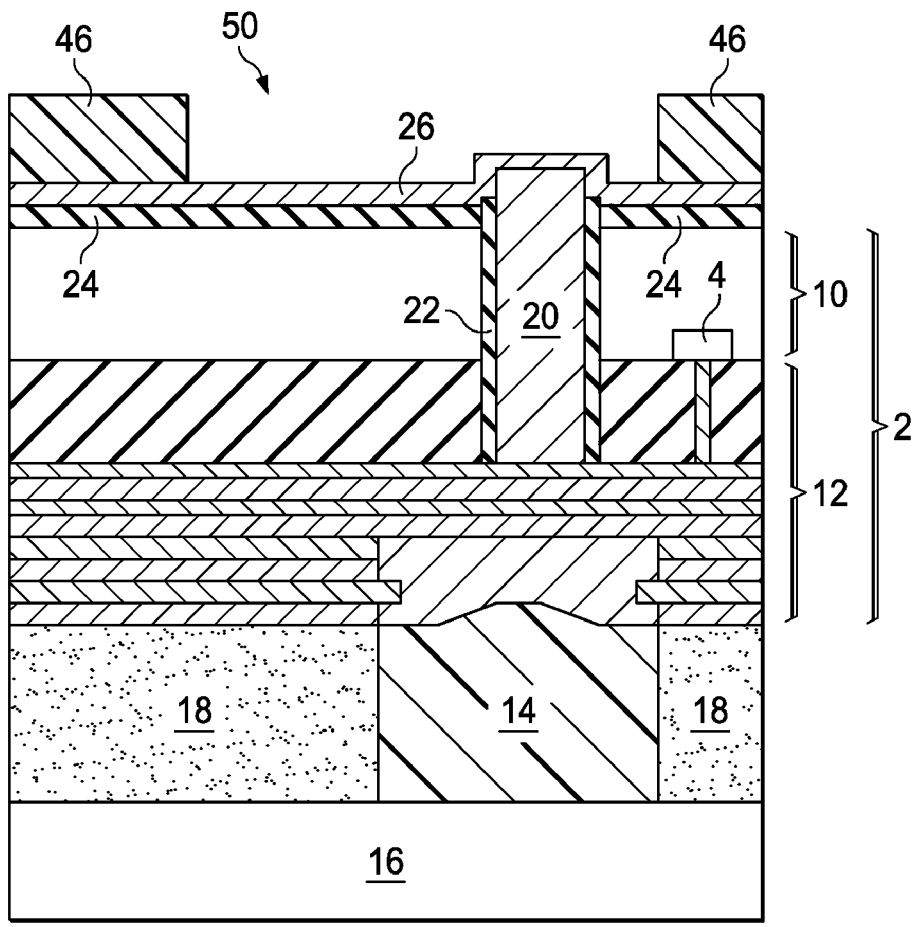

Referring to FIG. 7A, thin seed layer 26, also known as an under-bump metallurgy (UBM) 26, is blanket formed on backside isolation layer 24 and TSV 20. UBM 26 may be formed by sputtering or other applicable methods. The usable materials of UBM 26 include copper or copper alloys. However, other metals, such as silver, gold, aluminum, and combinations thereof, may also be included.

Figure 7B:
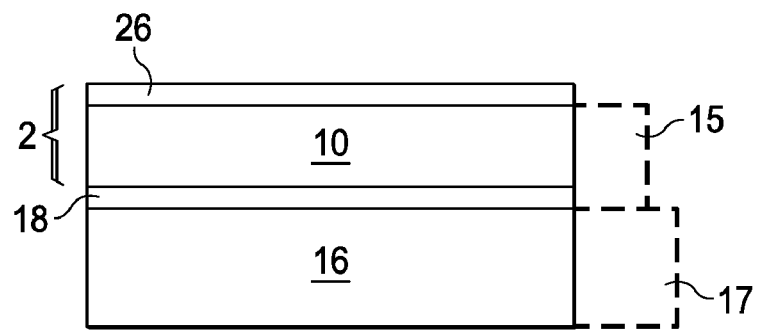

FIG. 7B illustrates an edge portion of the structure shown in FIG. 7A. For simplicity, only UBM 26, wafer 2, adhesive 18, and carrier wafer 16 are illustrated, while other components are not shown. It is observed that since notch 17 in carrier wafer 16 is formed under notch 15 in wafer 2, no UBM 26 will be deposited on carrier wafer 16 and exposed through notch 15. Therefore, the equipment for performing the subsequent process steps such as photo steppers may find notch 15 easily, resulting in a more reliable process.

FIG. 7A also illustrates the formation of mask 46. In an embodiment, mask 46 is a photoresist. Alternatively, mask 46 is formed of dry film, which may include an organic material such as Ajinimoto buildup film (ABF). Mask 46 is then patterned to form opening 50 in mask 46, with TSV 20 (and the overlying portion of UBM 26) being exposed through opening 50. Since carrier wafer 16 is notched, more accurate alignment can be performed in the patterning of mask 46.

Figure 8:
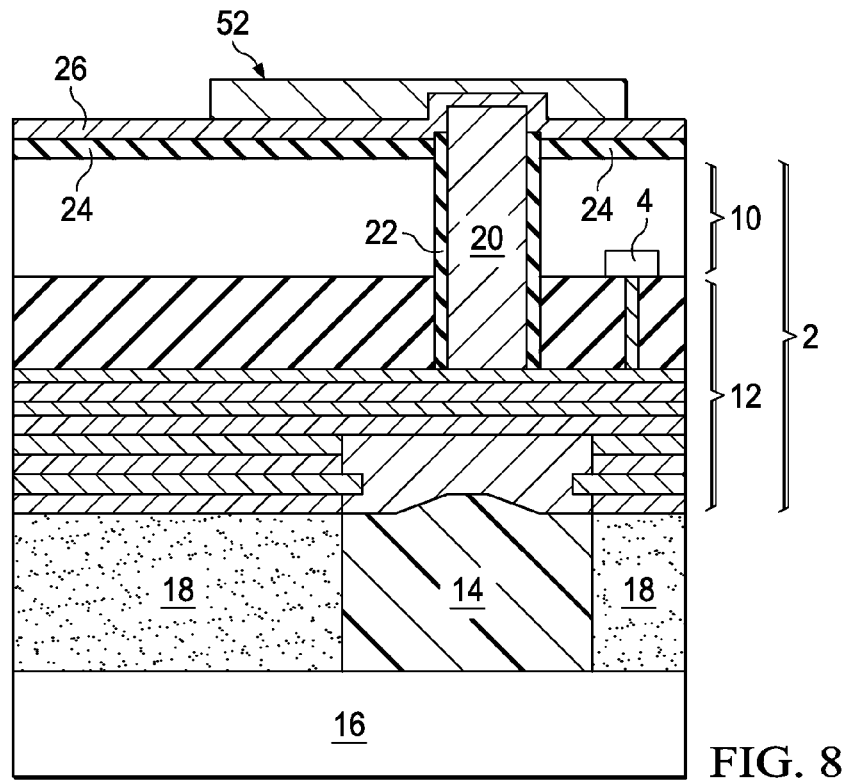

In FIG. 8, opening 50 as shown in FIG. 7A is selectively filled with a metallic material, forming redistribution line (RDL) 52 in opening 50. In the preferred embodiment, the filling material includes copper or copper alloys, although other metals, such as aluminum, silver, gold, or combinations thereof, may also be used. The formation methods may include electro-chemical plating (ECP), electroless plating, or other commonly used deposition methods such as sputtering, printing, and chemical vapor deposition (CVD) methods. Mask 46 is then removed. As a result, the portions of UBM 26 underlying mask 46 are exposed.

Figure 9:
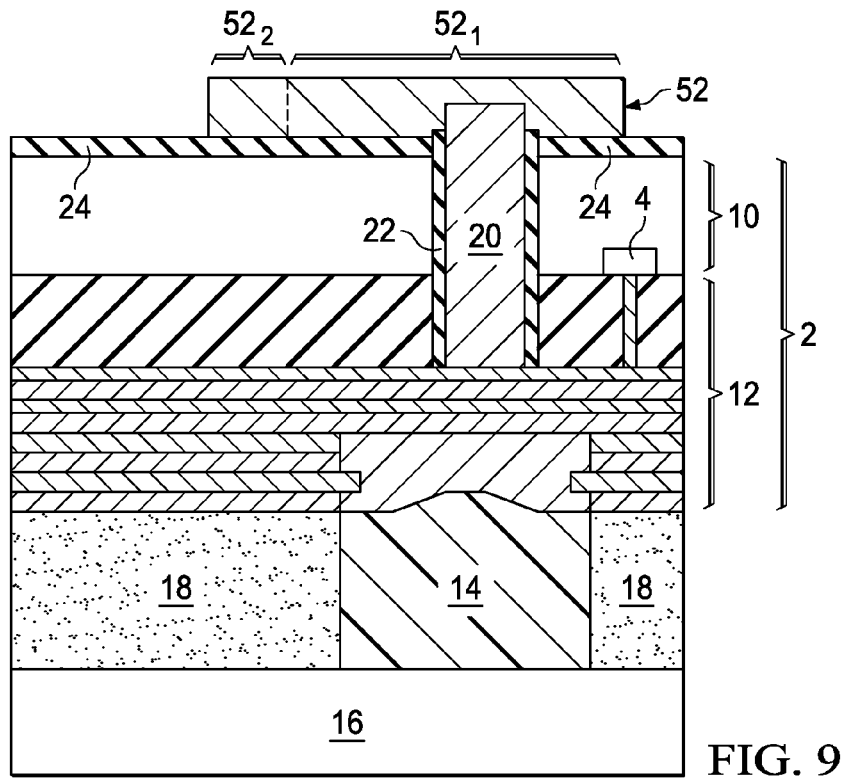

Referring to FIG. 9, the exposed portions of UBM 26 are removed by a flash etching. The remaining RDL 52 may include RDL strip (also referred to as a redistribution trace) $52_1$ that includes a portion directly over, and connected to, TSV 20, and optionally pad $52_2$ joining RDL strip $52_1$. In FIG. 9 and subsequent figures, UBM 26 is not shown since it is typically formed of similar materials as RDL 52, and thus it appears to be merged with RDL 52. As a result of the flash etching, a thin layer of RDL 52 is also removed. However, the removed portion of RDL 52 is negligible compared to its overall thickness.

Figure 10:
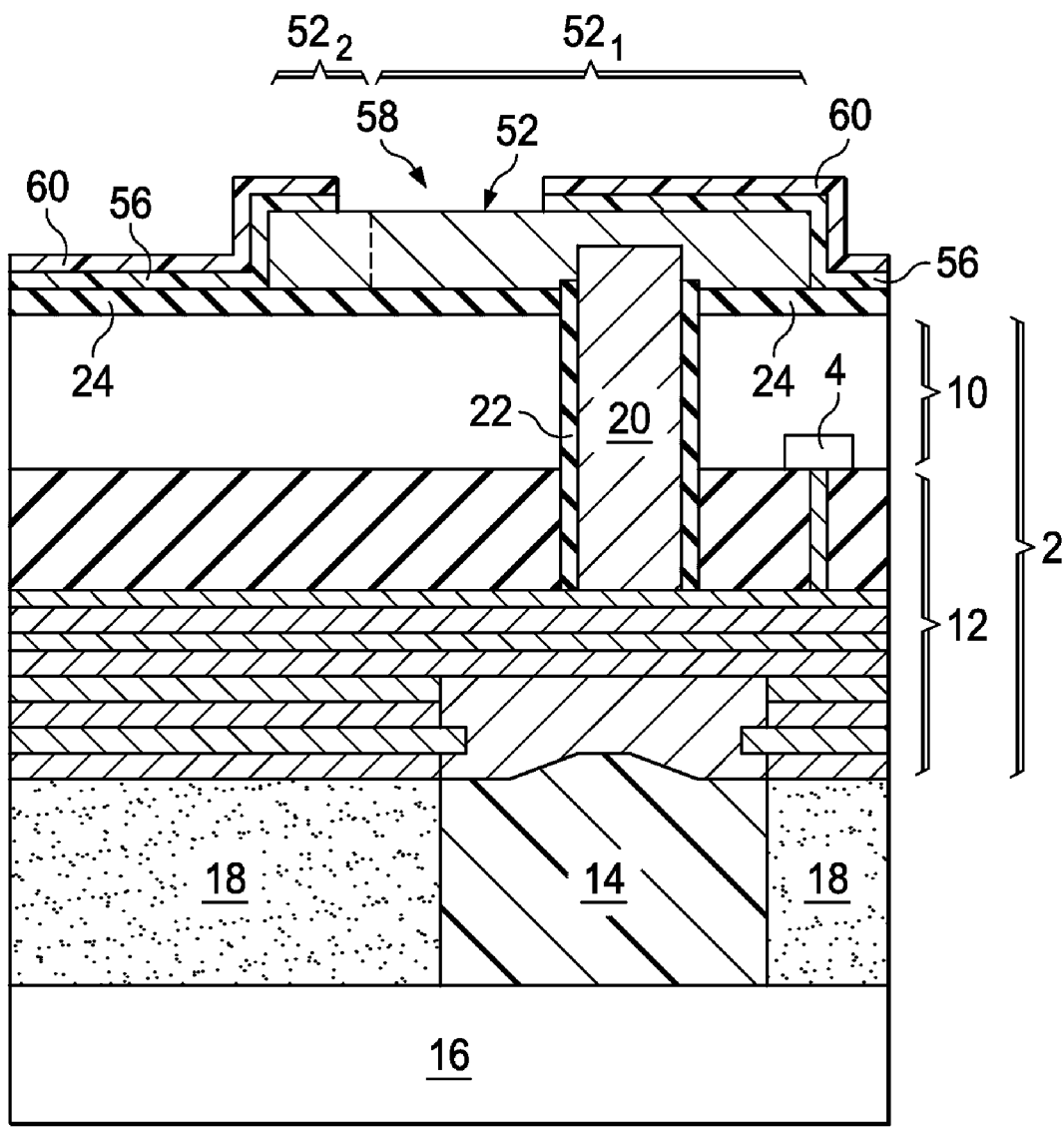

Next, as shown in FIG. 10, passivation layer 56 is blanket formed and patterned to form opening 58. Passivation layer 56 may be formed of nitrides, oxides, polyimide, and the like. Photo resist 60 is applied and developed to define the pattern of opening 58. A portion of pad $52_2$ is exposed through opening 58 in passivation layer 56. Opening 58 may occupy a center portion of pad $52_2$. RDL strip portion $52_1$ may continue to be covered by passivation layer 56.

Figure 11:
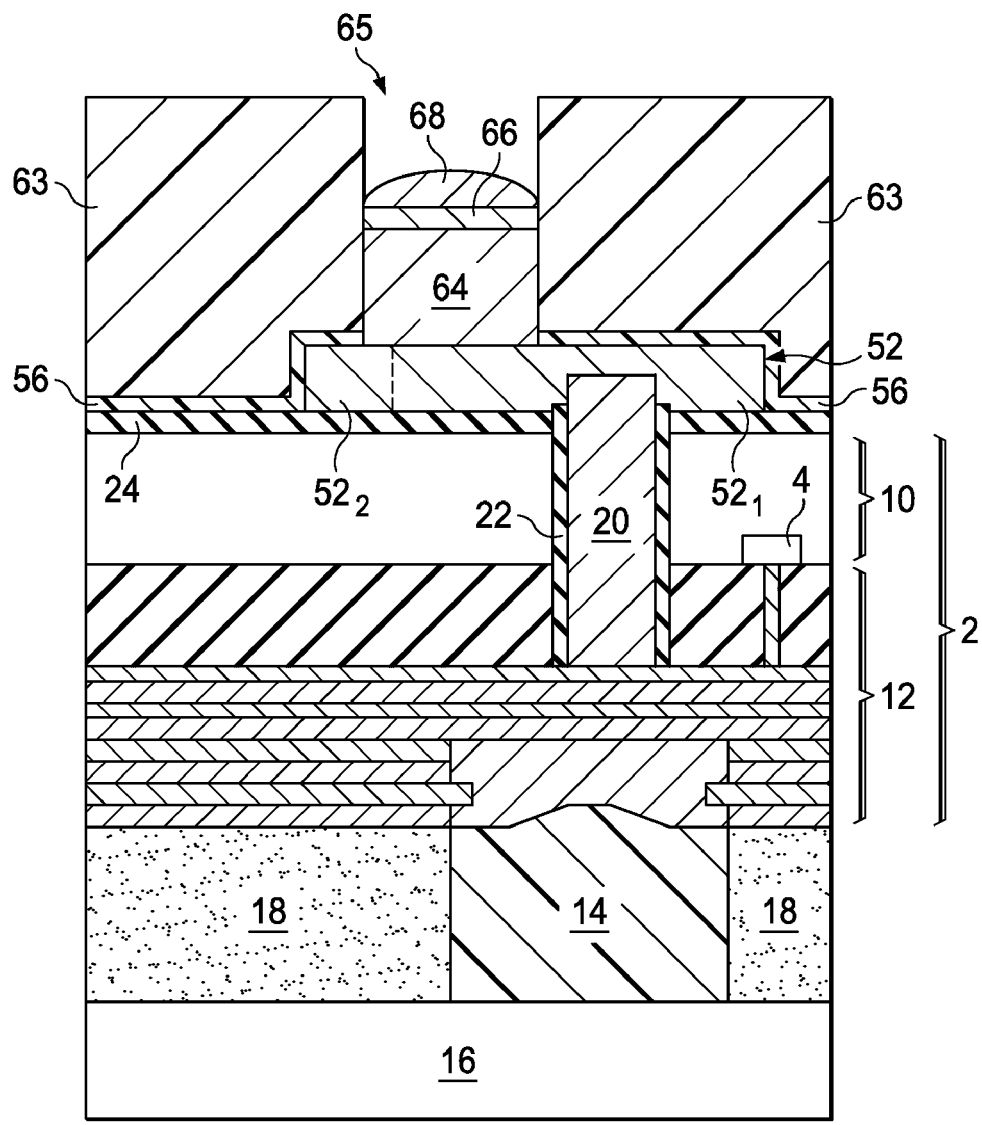

Next, as shown in FIG. 11, photo resist 60 is removed, and a bonding pad including 64 and 66, is formed. In an embodiment, photo resist 63 is formed. Photo resist 63 is preferably thicker than photo resist 60. In an embodiment, the thickness of photo resist 63 is greater than about 20 µm, or even greater than about 60 µm. Photo resist 63 is patterned to form opening 65, through which RDL pad $52_2$ is exposed. Next, copper pillar 64 is formed starting from opening 65 by electro plating. Copper pillar 64 may comprise copper and/or other metals such as silver, gold, tungsten, aluminum, and combinations thereof. Barrier layer 66, which may be formed of nickel, may be formed on copper pillar 64, and solder 68 may be formed on barrier layer 66.

Figure 12:
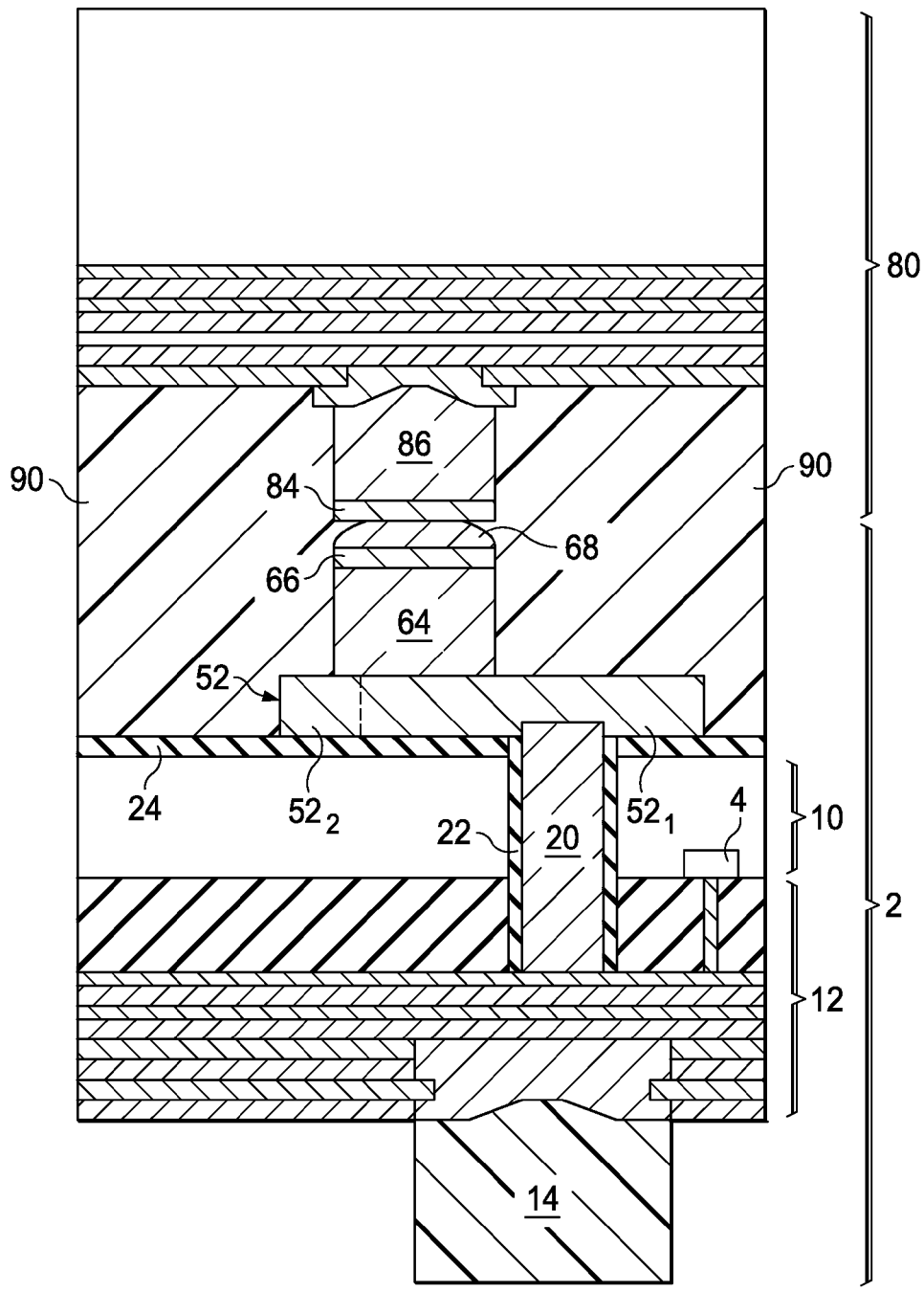

Referring to FIG. 12, photo resist 63 is removed. Carrier wafer 16 may then be demounted from wafer 2. The structure as shown in FIG. 10 may be bonded to another chip or wafer such as chip/wafer 80. In an exemplary embodiment, chip/wafer 80 has copper post 86 and barrier layer 84 on its front surface, wherein solder 68 may be reflowed to join wafers 2 and 80. Underfill 90 may be filled between wafer 2 and chip/wafer 80. In alternative embodiments, wafer 2 may be sawed apart into chips before being bonded to other chips/wafers. In alternative embodiments, the demounting of carrier wafer 16 may be performed after wafer 2 is bonded onto chip/wafer 80.

In the embodiments discussed in the preceding paragraphs, the backside interconnect structure of TSVs is used as an example to explain the concept of the embodiment. It is appreciated that the concept of the embodiment may also be used on all other manufacturing processes involving carrier wafers, such as wafer-to-wafer bonding processes.

The embodiments have several advantageous features. By forming notches in carrier wafers, no UBM will be deposited to the portions of the carrier wafers exposed through the notches in the semiconductor wafers. More reliable alignment may thus be performed. With corners of carrier wafers not having beveled areas, the peeling of the UBM is reduced. Further, with reduced resistivity of carrier wafers, carrier wafers can be more reliably secured onto E-chucks.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of forming an integrated circuit structure, the method comprising:
   providing a semiconductor wafer comprising a first notch extending from an edge of the semiconductor wafer into the semiconductor wafer, and a through-semiconductor via (TSV) extending into the semiconductor wafer;
   mounting a carrier wafer onto the semiconductor wafer, wherein the carrier wafer comprises a second notch in the carrier wafer, and wherein the step of mounting the carrier wafer comprises overlapping at least a portion of the first notch with at least a portion of the second notch;
   after the step of mounting the carrier wafer, grinding a backside of the semiconductor wafer to expose the TSV;
   depositing a conductive layer on the backside of the semiconductor wafer and electrically connected to the TSV; and
   after the step of depositing, demounting the carrier wafer from the semiconductor wafer.

2. The method of claim 1, wherein the second notch extends from an edge of the carrier wafer into the carrier wafer.

3. The method of claim 1, wherein the step of mounting the carrier wafer comprises aligning edges of the second notch to edges of the first notch.

4. The method of claim 1, wherein a portion of the second notch less than an entirety of the second notch overlaps an entirety of the first notch.

5. The method of claim 1, wherein a portion of the first notch less than an entirety of the first notch overlaps an entirety of the second notch.

6. The method of claim 1, wherein the semiconductor wafer comprises active devices, and wherein the carrier wafer comprises a glass wafer.

7. The method of claim 1, wherein substantially all corners of the carrier wafer on a side facing the semiconductor wafer have a sharp profile, and wherein the substantially all corners of the carrier wafer form 90 degree angles.

8. The method of claim 1, wherein the carrier wafer has a resistivity lower than about $1 \times 10^8$ Ohm-cm.

9. The method of claim 1, wherein a combined structure comprising the carrier wafer and the semiconductor wafer has a warpage of less than about 20 μm.

10. A method of forming an integrated circuit structure, the method comprising:
   providing a semiconductor wafer comprising active devices, wherein the semiconductor wafer comprises a first notch extending from an edge of the of the semiconductor wafer into the semiconductor wafer; and
   mounting a carrier wafer onto the semiconductor wafer, wherein the carrier wafer comprises a glass wafer, wherein the carrier wafer comprises a second notch, wherein the second notch overlaps at least a portion of the first notch, and wherein the carrier wafer is joined to the semiconductor wafer through an adhesive layer.

11. The method of claim 10 further comprising demounting the carrier wafer from the semiconductor wafer.

12. The method of claim 10, wherein the carrier wafer has a resistivity lower than about $1 \times 10^8$ Ohm-cm.

13. The method of claim 10, wherein a combined structure comprising the carrier wafer and the semiconductor wafer has a warpage of less than about 20 μm.

14. A method of forming an integrated circuit structure, the method comprising:
   providing a semiconductor wafer; and
   mounting a carrier wafer onto the semiconductor wafer, wherein substantially all corners of the carrier wafer on a side facing the semiconductor wafer have a sharp profile with a 90 degree angle, and wherein the carrier wafer has a resistivity lower than about $1 \times 10^8$ ohm.

15. The method of claim 14, wherein the semiconductor wafer comprises a first notch extending from an edge of the semiconductor wafer into the semiconductor wafer, and the carrier wafer comprises a second notch, and wherein the step of mounting the carrier wafer comprises aligning the second notch to overlap at least a portion of the first notch.

16. The method of claim 11, wherein the semiconductor wafer comprises a semiconductor substrate, and a through-semiconductor via (TSV) extending into the semiconductor substrate, and wherein the method further comprises, before the step of demounting the carrier wafer from the semiconductor substrate, forming an under-bump metallurgy (UBM) on a side of the semiconductor substrate and electrically connected to the TSV.

* * * * *